(12) United States Patent
Chen et al.

(10) Patent No.: US 9,960,754 B2
(45) Date of Patent: May 1, 2018

(54) METHOD AND APPARATUS FOR INTERLACED AMPLITUDE PULSING USING A HARD-TUBE TYPE PULSE GENERATOR

(75) Inventors: Gongyin Chen, Henderson, NV (US); Robert Edward Drubka, Scottsdale, AZ (US)

(73) Assignee: Varex Imaging Corporation, Salt Lake City, UT (US)

( * ) Notice: Subject to any disclaimer, the term of this patent is extended or adjusted under 35 U.S.C. 154(b) by 853 days.

(21) Appl. No.: 12/795,894

(22) Filed: Jun. 8, 2010

(65) Prior Publication Data
US 2011/0298299 A1    Dec. 8, 2011

(51) Int. Cl.
| H03K 3/00 | (2006.01) |
| H03K 3/543 | (2006.01) |
| H03K 3/64 | (2006.01) |
| H03K 3/78 | (2006.01) |
| H03K 7/02 | (2006.01) |

(52) U.S. Cl.
CPC .............. *H03K 3/543* (2013.01); *H03K 3/64* (2013.01); *H03K 3/78* (2013.01); *H03K 7/02* (2013.01)

(58) Field of Classification Search
CPC ................................... H03K 3/64; H03K 3/78
USPC ......................................................... 307/108
See application file for complete search history.

(56) References Cited

U.S. PATENT DOCUMENTS

| 3,617,854 A | * | 11/1971 | Cole | 363/60 |
| 3,739,385 A | * | 6/1973 | Bechtel | G01S 1/02 343/705 |
| 3,778,636 A | * | 12/1973 | Chase, Sr. | 307/108 |
| 3,832,568 A | * | 8/1974 | Wang | H03K 3/33 307/106 |
| 3,927,366 A | * | 12/1975 | Mulier et al. | 324/436 |
| 3,930,335 A | * | 1/1976 | Widmayer | 47/58.1 R |
| 4,812,770 A | * | 3/1989 | Dravkin | 327/300 |
| 4,827,267 A | * | 5/1989 | Shearin | 342/201 |
| 5,495,209 A | * | 2/1996 | Gerstenberg | 332/108 |
| 5,587,680 A | * | 12/1996 | Smith | 327/291 |
| 5,804,967 A | * | 9/1998 | Miller | G01R 33/441 324/307 |

(Continued)

FOREIGN PATENT DOCUMENTS

| EP | 1176720 A2 | 1/2002 |
| GB | 2071001 A1 | 9/1981 |

OTHER PUBLICATIONS

Glasoe and Labacqz, "Pulse Generators", 1965, Dover Publications Inc., vol. 5 in the MIT Radiation Laboratory series, all pages.*

(Continued)

*Primary Examiner* — Adi Amrany
(74) *Attorney, Agent, or Firm* — Fitch, Even, Tabin & Flannery, LLP

(57) ABSTRACT

These various embodiments serve to facilitate interlaced amplitude pulsing using a hard-tube type pulse generator having at least one energy-storage unit each comprising at least one energy-storing capacitor. Generally speaking, this comprises controlling an amount of energy withdrawn from the energy-storage unit and provided to an output load to form productive electric pulses by controlling at least one of: (1) energy replenishment; and (2) non-productive energy withdrawal of the energy-storage unit, to thereby achieve a series of productive interlaced amplitude electric pulses.

30 Claims, 5 Drawing Sheets

(56) References Cited

U.S. PATENT DOCUMENTS

| | | | |
|---|---|---|---|
| 6,076,018 A * | 6/2000 | Sturman | A61N 1/08 607/2 |
| 6,298,266 B1 * | 10/2001 | Rubin et al. | 607/5 |
| 6,617,586 B2 | 9/2003 | Woodburn et al. | |
| 6,686,596 B2 | 2/2004 | Woodburn et al. | |
| 6,741,484 B2 | 5/2004 | Crewson et al. | |
| 6,806,783 B2 | 10/2004 | Baumann et al. | |
| 7,127,288 B2 * | 10/2006 | Sturman | A61N 1/08 320/166 |
| 7,209,373 B2 * | 4/2007 | Oicles et al. | 363/59 |
| 7,885,049 B2 * | 2/2011 | Crewson et al. | 361/98 |
| 8,145,303 B2 * | 3/2012 | Rubin et al. | 607/5 |
| 8,270,184 B2 * | 9/2012 | Grande et al. | 363/21.12 |
| 8,279,571 B2 * | 10/2012 | Crewson et al. | 361/98 |
| 2005/0090732 A1 * | 4/2005 | Ivkov et al. | 600/411 |
| 2007/0023399 A1 | 2/2007 | Buhler et al. | |
| 2008/0284276 A1 * | 11/2008 | McDonald | B82Y 30/00 310/308 |
| 2009/0121160 A1 | 5/2009 | Winkler et al. | |
| 2009/0316438 A1 | 12/2009 | Crewson et al. | |
| 2010/0038971 A1 | 2/2010 | Sanders et al. | |
| 2010/0066593 A1 * | 3/2010 | Takashima | H01J 25/587 342/175 |

OTHER PUBLICATIONS

PCT Search Report and Written Opinion from related application No. PCT/US2011/039469; dated Dec. 27, 2011; 11 pages.

Extended European Search Report from related European Patent Application No. 11793035.4 dated Oct. 15, 2013; 9 pages.

Article 94(3) EPC from related European Patent Application No. 11793035.4 dated Jul. 16, 2014; 5 pages.

* cited by examiner

METHOD AND APPARATUS FOR INTERLACED AMPLITUDE PULSING USING A HARD-TUBE TYPE PULSE GENERATOR

RELATED APPLICATION(S)

This application is related to co-pending and co-owned U.S. patent application Ser. No. 12/228,350, entitled INTERLACED MULTI-ENERGY RADIATION SOURCES and filed Feb. 18, 2010, which is incorporated by this reference in its entirety herein.

TECHNICAL FIELD

This invention relates generally to hard-tube type pulse generators and more particularly to interlaced amplitude pulsing.

BACKGROUND

Hard-tube type pulse generators are known in the art. Such generators use one or more switches to permit high amounts of electrical energy to be quickly withdrawn from one or more energy-storage units and applied to an output load that consumes this energy to generate another form of energy in the form of pulses. (Originally, these switches comprised vacuum tubes, hence the name "hard-tube type pulse generator." Modern generators of this type typically utilize solid state devices in lieu of vacuum tubes for these switches. Those skilled in the art recognize, however, the original name "hard-tube type pulse generators" as applying to both solid state device-based generators as well as the original vacuum tube-based generators. This description presumes this common definition of "hard-tube type pulse generator" when using this expression.)

Generally speaking, most such generators are designed so that only a small fraction of the energy storage unit's stored energy reserves are drained per switching event in order to attain an approximately rectangular-shaped output waveform. (The reader interested in learning more about pulse generators would do well to begin with the seminal work "Pulse Generators" as edited by Glasoe and Lebacqz and as comprises a part of the Massachusetts Institute of Technology "Radiation Laboratory Series" (published 1948 by McGraw Hill Book Company, Inc.), the full contents of which are incorporated herein by this reference.)

Using pulse generators to yield interlaced amplitude pulses is also known in the art. "Interlaced amplitude pulses" comprises a series of pulses wherein at least two of the pulses have amplitudes that are intentionally different from one another. Such pulses, by way of example, can serve to drive the production of a series of radiation beams having energy that also differ from pulse to pulse. In many cases, however, the prior art employs line-type pulse generators to produce such interlaced amplitude pulses. Though useful for many application purposes, such an approach does not necessarily represent a wholly satisfactory solution.

BRIEF DESCRIPTION OF THE DRAWINGS

The above needs are at least partially met through provision of the method and apparatus pertaining to interlaced amplitude pulsing using a hard-tube type pulse generator described in the following detailed description, particularly when studied in conjunction with the drawings, wherein.

Figure 1:
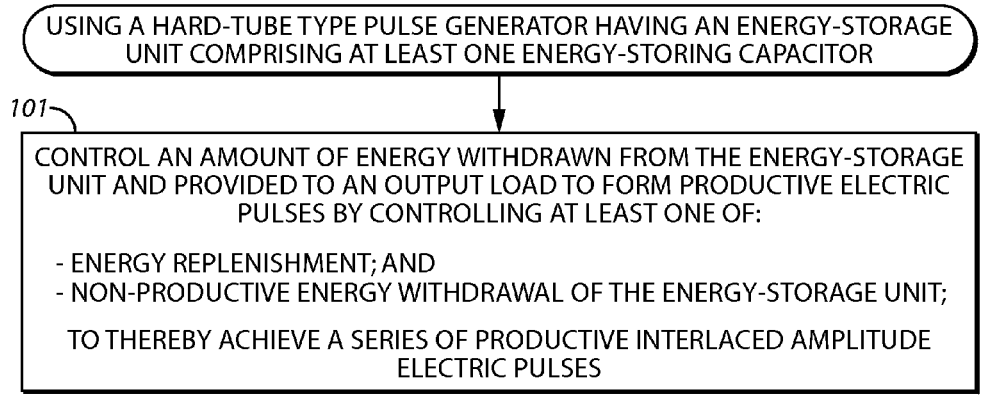
FIG. 1 comprises a flow diagram as configured in accordance with various embodiments of the invention.

Elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. Certain actions and/or steps may be described or depicted in a particular order of occurrence while those skilled in the art will understand that such specificity with respect to sequence is not actually required. The terms and expressions used herein have the ordinary technical meaning as is accorded to such terms and expressions by persons skilled in the technical field as set forth above except where different specific meanings have otherwise been set forth herein.

DETAILED DESCRIPTION

These various embodiments serve to facilitate interlaced amplitude pulsing using a hard-tube type pulse generator having at least one energy-storage unit each comprising at least one energy-storing capacitor. Generally speaking, this comprises controlling an amount of energy withdrawn from the energy-storage unit and provided to an output load to form productive electric pulses by controlling at least one of: (1) energy replenishment; and (2) non-productive energy withdrawal of the energy-storage unit, to thereby achieve a series of productive interlaced amplitude electric pulses.

These teachings provide for controlling the aforementioned energy replenishment, for example, by intentionally not fully recharging the energy-storage unit after withdrawing some energy from the energy-storage unit to create one of a series of productive interlaced amplitude electric pulses. By one approach, this can comprise not fully recharging the energy-storage unit after each of a series of such productive energy-withdrawal events.

These teachings provide for controlling the aforementioned non-productive energy withdrawal of the energy-storage unit by, for example, selectively withdrawing energy from the energy-storage unit to achieve a particular energy availability to be used when creating a given one of the productive interlaced amplitude electric pulses. By one approach, this can comprise using one or more dummy loads to selectively withdraw such energy (prior, for example, to creating the productive interlaced amplitude electric pulse). Such a load can be placed, for example, electrically parallel to the hard-tube type pulse generator's output load.

As another example in these regards, these teachings will accommodate controlling such non-productive energy withdrawal by delivering one or more electric pulses to the pulse generator's output load while also disabling another part of a corresponding radio frequency (RF) particle accelerator based radiation source such that no desired system product (such as an intended radiation beam) is produced. As one non-limiting example in these regards, this disabled system element can comprise, at least in part, a particle source as typically comprises a part of such a particle accelerator.

As yet another example in these regards, these teachings will accommodate controlling the non-productive energy withdrawal by selectively dividing the amplitude of the withdrawn energy between the output load and one or more dummy loads. This can comprise, for example, selectively configuring the dummy load to bear part of the voltage available at the energy-storage unit while creating the productive interlaced amplitude electric pulses such that the output load receives a predetermined and desired amplitude to support this productive purpose.

Such a hard-tube type pulse generator can readily comprise a part of an interlaced multi-energy radiation source and effectively serve the operating requirements of the radiation source. These teachings are highly flexible in practice and will accommodate a considerable range of configurations in these regards. These teachings are also highly scalable and can be used in a wide variety of application settings.

These and other benefits may become clearer upon making a thorough review and study of the following detailed description. Referring now to the drawings, and in particular to FIG. 1, an illustrative process 100 that is compatible with many of these teachings will now be presented. As noted above, this process 100 can be used in conjunction with a hard-tube type pulse generator that in this example includes only one energy-storage unit comprising at least one energy-storing capacitor. For the sake of illustration, but without intending any limitations in these regards, this description will presume that this hard-tube type pulse generator comprises a part of an interlaced multi-energy radiation source.

Figure 2:
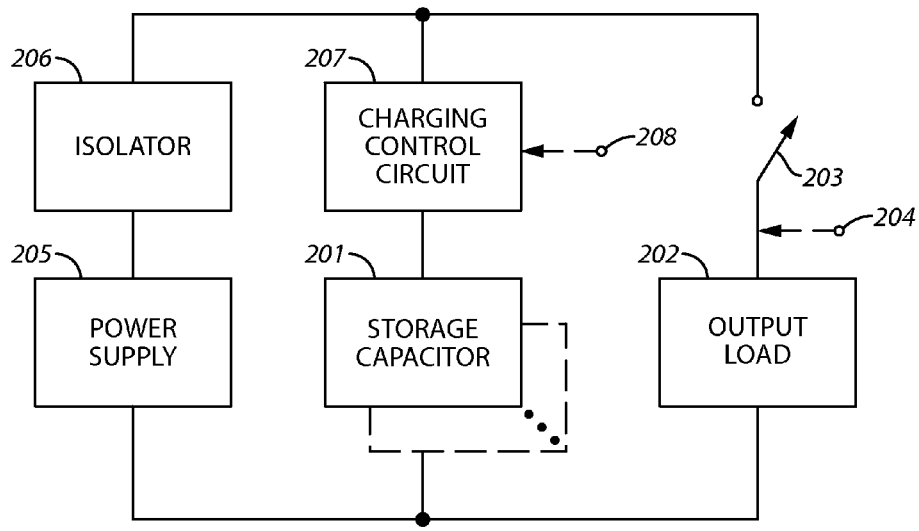
FIG. 2 comprises a block diagram as configured in accordance with various embodiments of the invention.

Generally speaking, and referring momentarily to FIG. 2, such a generator 200 can comprise one or more storage capacitors 201 that selectively provide energy to an output load 202. In a typical application setting this output load 202 will comprise an energy-conversion device (such as, but not limited to, a microwave magnetron or klystron or a primary winding of a transformer) that consumes electrical energy as provided by the capacitor(s) 201 to generate other forms of energy. More specifically, in many application settings this output load 202 will comprise, in part, a primary winding of a transformer. (Those skilled in the art will know that in some cases the transformer may have a plurality of primary windings, with each primary winding being selectively connected to its own energy-storage unit and switches.) An output load switch 203 (responsive to a corresponding control signal 204) typically serves to couple the output load 202 to the storage capacitor(s) 201 to permit the described provision of energy.

Connecting the storage capacitor(s) 201 to the output load 202 will, of course, withdraw some of the stored energy of the capacitor(s) 201. In a typical hard-tube type pulse generator this withdrawal is less than complete. In many cases, in fact, the generator uses only a small portion of the stored energy for each output pulse. Some generators, for example, withdraw only from about two percent to about ten percent of the capacitor's fully-charged energy reserves for each output pulse. A typical generator also includes a power supply 205 (and isolator 206 to protect the power supply 205 from the capacitor's discharges) to recharge the capacitor(s) 201.

The above-noted components, including their manner of usage, are well known. Accordingly, further elaboration will not be provided here in these regards except where particularly appropriate to the description.

Referring again to FIG. 1, at step 101 this process 100 provides for controlling an amount of energy that is withdrawn from the hard-tube type pulse generator's energy-storage unit and provided to the generator's output load to form productive electric pulses. (As used herein, it will be understood that a "productive" electric pulse is one that accomplishes a productive use, such as driving an RF particle accelerator based radiation source to thereby produce an intended radiation beam. "Intended radiation," in turn, refers to radiation such as an x-ray beam that is produced at an x-ray target at rated beam energy and output. Accordingly, incidental radiation produced by some platforms would not alone represent "intended radiation" even when the creation of such radiation is known to occur a priori. For example, at least some Linac X-ray machines can produce so-called soft x-rays at the magnetron/klystron and at the gun and along the body of the accelerating structure, which soft x-rays are not produced at an x-ray target and do not comprise a part of the beam energy and output ratings of the machine.)

By one approach, this control comprises controlling energy replenishment for the energy-storage unit. By another approach, in combination with the foregoing or in lieu thereof, this control comprises non-productive energy withdrawal of the energy storage unit. (As used herein, it will be understood that "non-productive energy withdrawal" refers to a withdrawal of energy that does not yield an intended final product proportionate to the amount of energy so withdrawn. In the specific illustrative example of an RF particle accelerator based radiation source, "non-productive energy withdrawal" does not result in an intended radiation beam output. By one approach, "non-productive energy withdrawal" is achieved by delivering at least a substantial portion of the energy (such as at least 60%, 75% 90%, or even 100%) to a dummy load instead of an output load (such as a primary winding of a transformer or a magnetron or a klystron). By another approach, "non-productive energy withdrawal" is achieved by delivering at least a substantial portion of the energy to the output load, but at a time when another part (such as the particle source) of the RF particle accelerator is disabled such that no corresponding intended radiation beam output is produced.

By controlling one or both of these functional components, this process 100 in turn achieves a series of productive interlaced amplitude electric pulses. More particularly, these pulses can have selected and intended amplitudes. Accordingly, these teachings are readily and beneficially employed in conjunction with an interlaced multi-energy radiation source.

Controlling Energy Replenishment

As noted above, these teachings can provide for selectively controlling energy replenishment of a hard-tube type pulse generator's energy-storage unit in order to thereby also control the amplitudes of a series of interlaced amplitude electric pulses. Referring again to FIG. 2, the hard-tube type pulse generator 200 can further comprise a charging control circuit 207. By one approach, this charging control circuit 207 can itself comprise, in whole or in part, the controlling functionality. By another approach, this charging control circuit 207 may comprise, for example, a switch that responds to a control signal 208 (where, for example, a further charging control circuit (not shown) sources that control signal 208).

So configured, the storage capacitor 201 is not necessarily and automatically recharged following each discharge event.

As one example in these regards, this charging control circuit 207 can serve to intentionally not fully recharge the storage capacitor 201 after withdrawing some energy from the latter to create one of a series of productive interlaced amplitude electric pulses. By one approach, this can comprise not recharging the storage capacitor(s) 201 at all following one or more such withdrawals (though these teachings will also accommodate, if desired, only partially recharging one or more of the storage capacitors 201 following a given withdrawal).

Figure 3:
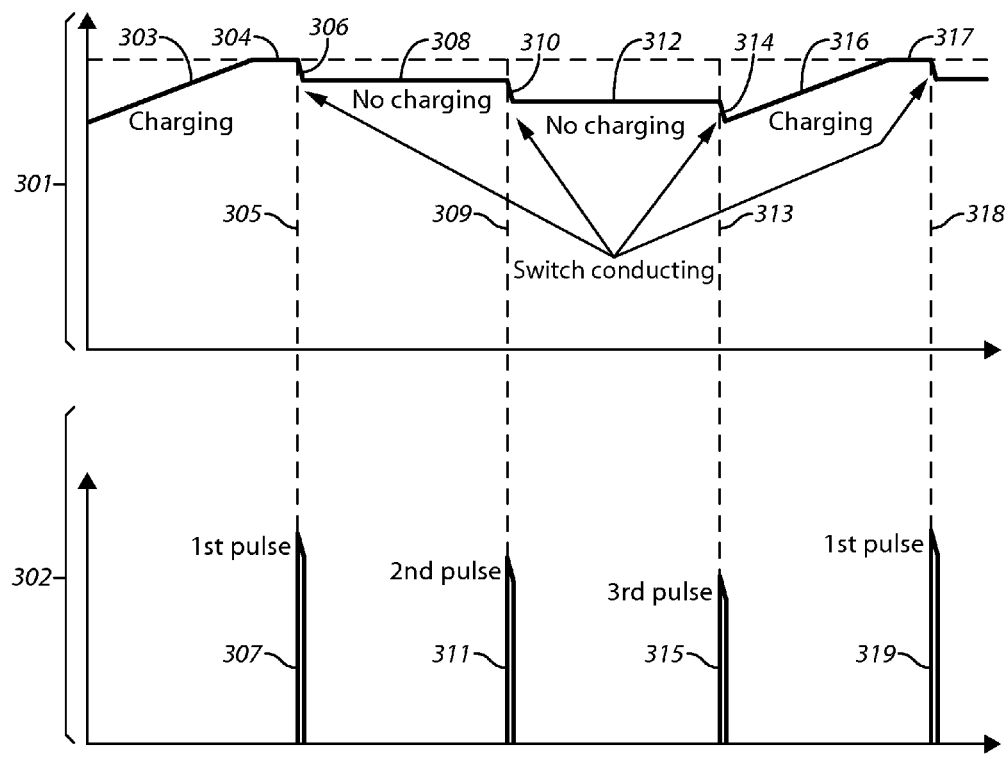
FIG. 3 comprises a timing diagram as configured in accordance with various embodiments of the invention.

Referring now to FIG. 3, a particular illustrative example will be provided in these regards. It will be understood that this example serves in an illustrative capacity and is not intended to suggest any particular limitations in these regards.

FIG. 3 depicts two phenomena 301 and 302 in a shared timeline. The first phenomenon 301 represents charging of the aforementioned storage capacitor(s). The second phenomenon 302 depicts, in turn, productive interlaced amplitude electric pulses provided by the corresponding hard-tube type pulse generator.

As this timeline begins, the storage capacitor(s) is charging 303 and becomes fully charged 304. At a given time 305 the pulse generator permits energy to be withdrawn 306 from the storage capacitor(s) and provided to the output load to thereby produce a corresponding output first pulse 307 having a first corresponding amplitude. Pursuant to these teachings, and contrary to ordinary practice in these regards, the storage capacitor(s) is intentionally not recharged 308 following this energy withdrawal 306.

At a next given time 309 the pulse generator again permits energy to be withdrawn 310 from the storage capacitor(s) and provided to the output load to thereby produce a second corresponding output pulse 311. As the storage capacitor(s) was somewhat depleted as compared to the previous discharging event, this second output pulse 311 has a lesser amplitude than the previous output pulse 307.

In this example, and again pursuant to these teachings, the storage capacitor(s) is again intentionally not recharged 312 following this energy withdrawal 310.

At a next given time 313, the pulse generator again permits energy to be withdrawn 314 from the storage capacitor(s) and provided to the output load to thereby produce a third corresponding output pulse 315. As the storage capacitor(s) was even further depleted as compared to the previous discharging event, this third output pulse 315 has a lesser amplitude than the previous output pulse 311.

In this example, the pulse generator now charges 316 the storage capacitor(s) to the point of being fully charged 317. Accordingly, the next time 318 the storage capacitor(s) is discharged, the corresponding output pulse 319 again has the same amplitude as the above-described first pulse 307. The foregoing can then repeat as desired to continue to provide a similar series of interlaced amplitude electric pulses.

The foregoing can be varied in numerous ways, of course. For example, instead of providing three interlaced amplitude electric pulses these teachings can be readily adjusted to yield only two interlaced amplitude electric pulses or four or more interlaced amplitude electric pulses as desired. As another example, when the pulse generator comprises two or more energy storage units and corresponding switches (each connected to a primary winding of a transformer), these teachings will accommodate intentionally not charging one or more energy storage units while permitting one or more energy storage units to charge. And as yet another example, these teachings will accommodate permitting the storage capacitor(s) to partially (but not fully) recharge after some of the withdrawal events to achieve a corresponding output electrical pulse having a desired amplitude.

Controlling Non-Productive Energy Withdrawal

As noted above, in lieu of the foregoing, or in combination therewith, these teachings will also accommodate achieving the desired results by controlling non-productive energy withdrawal from the storage capacitor(s).

Figure 4:
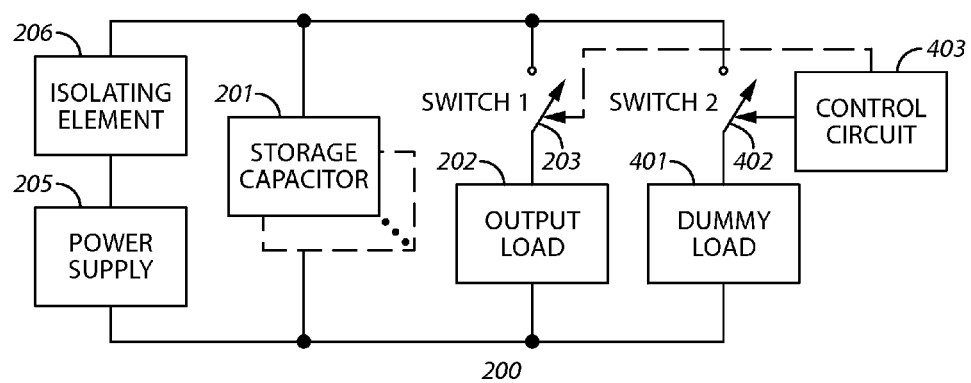
FIG. 4 comprises a block diagram as configured in accordance with various embodiments of the invention.

As one illustrative example in these regards (and again without intending to suggest limitations in these regards), FIG. 4 depicts a dummy load 401 configured in series with a corresponding switch 402 and in parallel with the hard-tube type pulse generator's 200 output load 202 and corresponding switch 203. Both are connected to storage capacitor(s) 201. A control circuit 403, in turn, controls this dummy load switch 402 (and optionally, output load switch 203 if desired) and hence controls when the dummy load 401 connects in a manner to draw energy from the storage capacitor(s) 201. So configured, the control circuit 403 can utilize the dummy load 401 to selectively withdrawn energy from the storage capacitor(s) 201 prior to creating a productive interlaced amplitude electric pulse. This, in turn, permits the control circuit 403 to control the amplitude of such a pulse.

Figure 5:
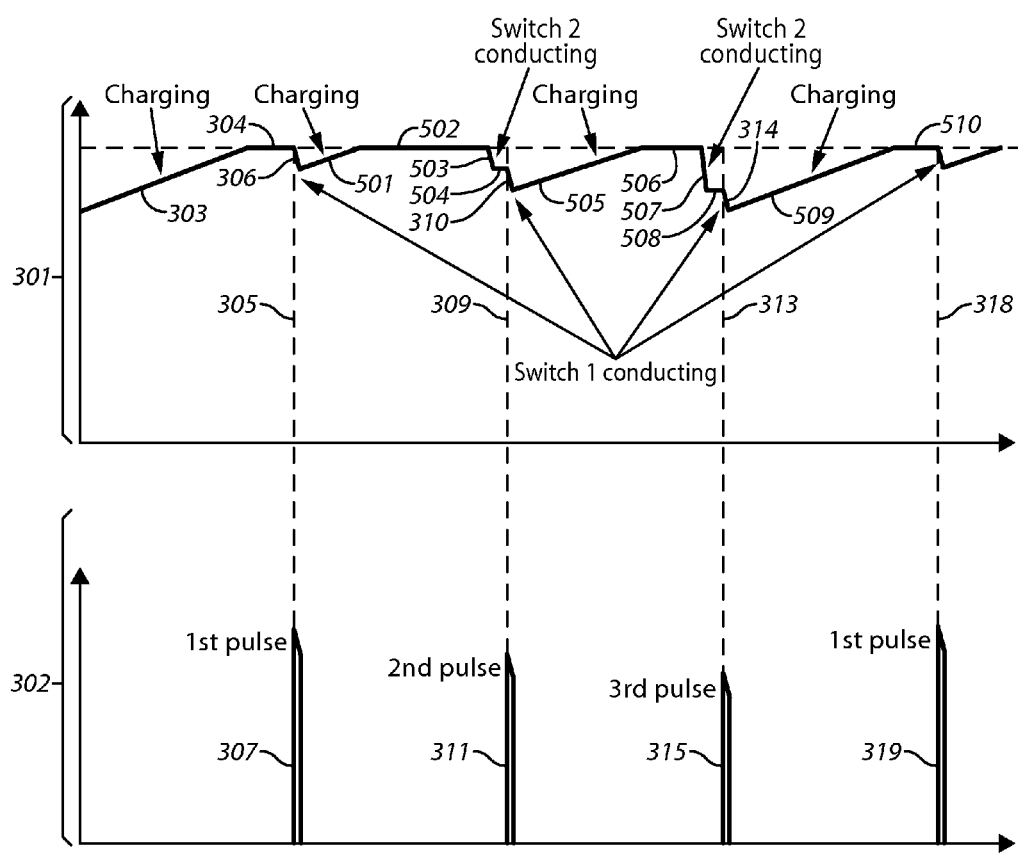
FIG. 5 comprises a timing diagram as configured in accordance with various embodiments of the invention.

FIG. 5 provides one illustrative example in these regards. As before, this example is not intended to comprise an exhaustive example of all possibilities in these regards.

In this example, the timeline begins with the storage capacitor(s) charging 303 until fully charged 304. As in the previous example, at a given time 305 the pulse generator permits energy to be withdrawn 306 from the storage capacitor(s) and utilized by the output load to yield a corresponding first pulse 307 having a corresponding amplitude.

Now, however, the pulse generator again recharges 501 the storage capacitor(s) and permits the storage capacitor(s) to become fully charged 502. Prior to again creating a next productive electrical pulse, however, the pulse generator now effects a non-productive withdrawal of energy 503 from the storage capacitor(s) by connecting the aforementioned dummy load to the latter in order to attain a particular charge level 504. Upon attaining this particular charge level 504 (or, in the alternative, upon achieving a particular amount of dummy load-based discharge time), the pulse generator disconnects the dummy load from the storage capacitor(s) to halt the unproductive discharging process.

Now, at the appointed time 309, the pulse generator connects the storage capacitor(s) to the output load to thereby permit a corresponding withdrawal of energy 310 that yields a corresponding second electrical pulse 311 having a smaller amplitude than the previous first electrical pulse 307.

As before, the pulse generator now again recharges 505 the storage capacitor(s) until the latter is fully charged 506. And again as before, the pulse generator utilizes the dummy load to unproductively withdraw energy 507 from the storage capacitor(s). This unproductive discharging draws the storage capacitor(s)'s energy down to a level 508 that is lower than the just-previous dummy load-based discharge.

At the appointed time 313, the pulse generator then connects the output load to the storage capacitor(s) to withdraw energy 314 from the latter to thereby yield a corresponding third electrical pulse 315. This third electrical pulse 315 has an amplitude that is lower than previous electrical pulses (i.e., the first and second electrical pulses 307 and 311) in this series because the charge level of the storage capacitor(s) was drawn down to a lower level by the dummy load as described.

In this example, the storage capacitor(s) is then again charged 509 until fully charged 510 to permit the described sequence to repeat. So configured, a series of three interlaced amplitude electrical pulses are reliably produced. As before, a fewer or greater number of interlaced amplitude electrical pulses are readily created by use of this approach.

In the foregoing example, a dummy load serves to draw down the stored energy level of the storage capacitor(s) to a desired level. If desired, the output load of the hard-tube type pulse generator can itself serve in these regards. This can comprise, for example, connecting the output load to the storage capacitor(s) and delivering at least one electric pulse while concurrently disabling another part of an RF particle accelerator based radiation source such that no intended radiation beam is produced. In particular, although this creates an electric pulse at the output load (and RF power can be produced in the example of an RF accelerator based particle source), that electric pulse is an unproductive electric pulse rather than a productive electric pulse. In such a case, for example, the disabled element can comprise the particle source of the RF particle accelerator. In this case, the particle source does not provide particles to be accelerated and no intended radiation beam is produced (notwithstanding that RF power is produced).

Figure 6:
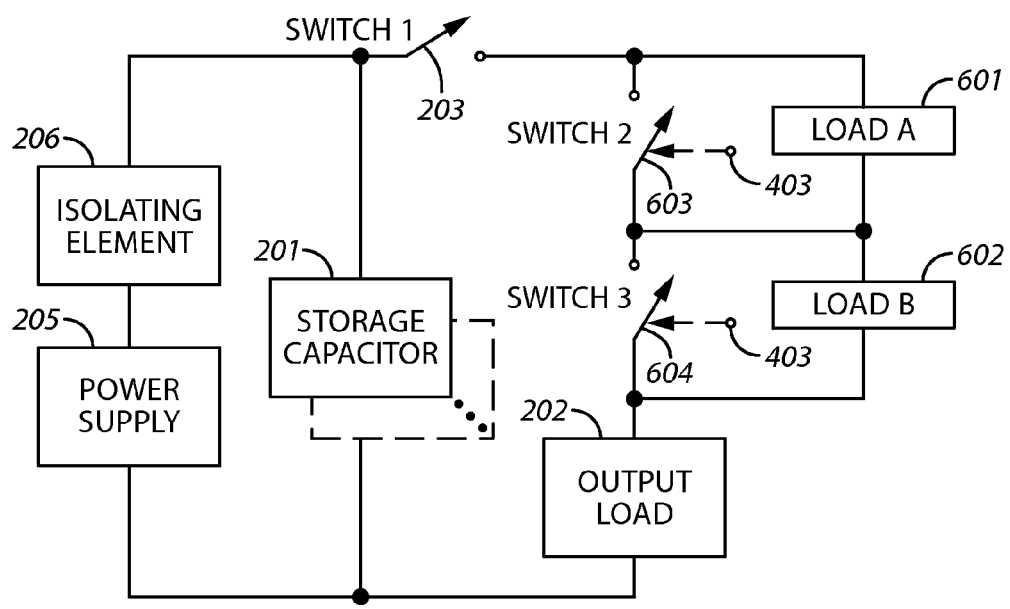
FIG. 6 comprises a block diagram as configured in accordance with various embodiments of the invention.

These teachings are sufficiently flexible to accommodate yet other approaches in these regards as well. FIG. 6 provides such an example. Again, FIG. 6 is offered without any intention of suggesting any corresponding limitations.

Here, the hard-tube type pulse generator 200 features two loads A and B (denoted by reference numerals 601 and 602) that are each connected in parallel to a corresponding switch 603 and 604, respectively. For example, such dummy loads can comprise one or more liquid-cooled resistive devices that dissipate electric power and generate heat. These two switches 603 and 604, in turn, are connected in series with the output load 202 and connected to the storage capacitor(s) 201.

So configured, with both of these switches 603 and 604 closed (and presuming that the output load switch 203 is also closed), the output load 202 withdraws energy from the storage capacitor(s) 201 and neither load A or B influence this withdrawal. With load A's switch 603 closed and load B's switch 604 open, however, this withdrawal of energy will now include load B as well as the output load 202. Similarly, with load A's switch 603 open and load B's switch 604 closed, this withdrawal of energy will include load A as well as the output load. Lastly, with both of these switches 603 and 604 open, this energy withdrawal will include both load A and B in series with the output load 202.

So configured, one or more of these supplemental loads can be used to selectively divide the amplitude at the storage capacitor(s) between the output load 202 and either or both of these dummy loads 601 and 602. Using this approach, the selected dummy load (601 and/or 602) bears part of the voltage available at the storage capacitor(s) while creating a given productive interlaced amplitude electric pulse such that the output load 202 receives a predetermined and desired amplitude for productive use.

Figure 7:
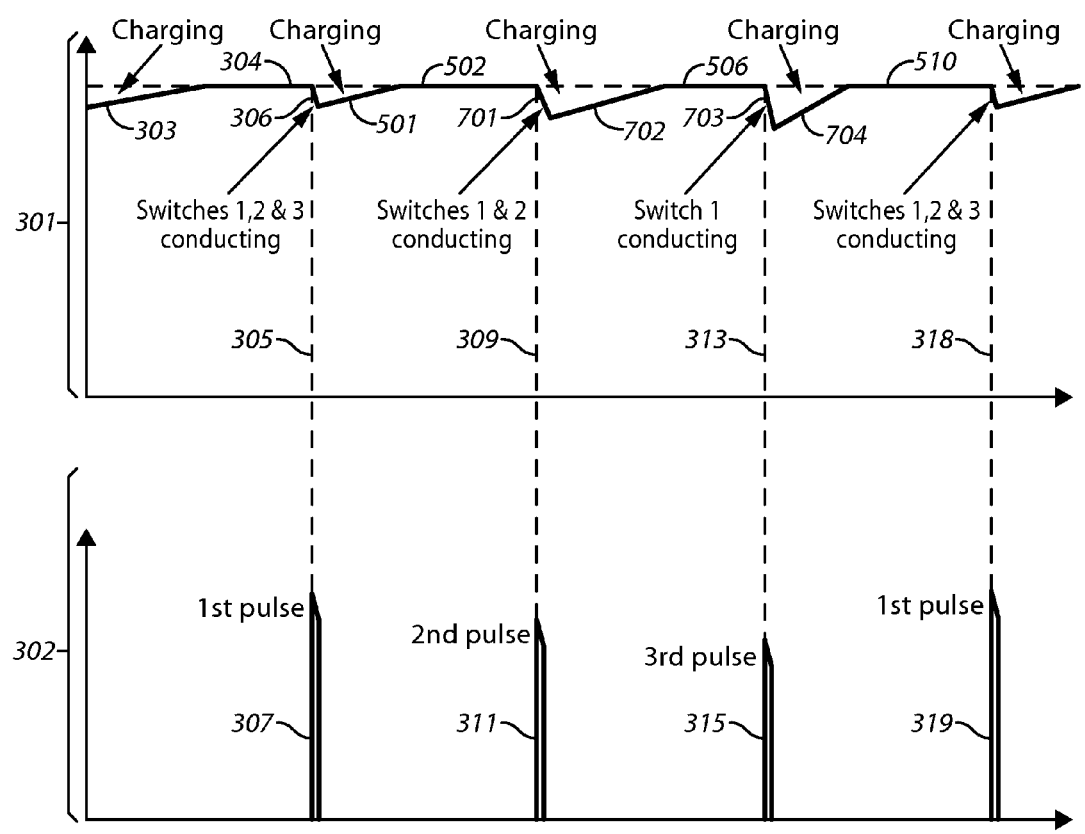
FIG. 7 comprises a timing diagram as configured in accordance with various embodiments of the invention.

FIG. 7 provides a non-limiting illustrative example in these regards. Again as before, this timeline begins with the storage capacitor(s) charging 303 to capacity 304. At the appointed time 305, all three switches depicted in FIG. 6 (203, 603, and 604) close. So configured, only the output load effectively connects and hence only the output load draws energy 306 from the storage capacitor(s). This yields a corresponding first electric pulse 307 as before.

The storage capacitor(s) then recharge 501 to capacity 502. At the next appointed time 309, the output load switch 203 and the load A switch 603 close. In turn, current from the storage capacitors flow through both the output load and load B. Because load B bears parts of the voltage, the output load receives a smaller amount of energy than before. Accordingly, the corresponding second electrical pulse 311 has a smaller amplitude than the first electrical pulse 307.

The storage capacitor(s) again recharge 702 to capacity 506. At the next appointed time 313, only the output load switch 203 closes. Accordingly, current from the storage capacitors flow through the output load and loads A and B. Because both load A and load B bear part of the voltage, an even-smaller portion is received by the output load itself. As a result, the corresponding third electrical pulse 315 has a smaller amplitude than the previous first and second electrical pulses 307 and 311.

In this example, the storage capacitor(s) again recharge 704 to capacity 510 and the described series of events repeats, beginning with production of another of the first electric pulses 319.

So configured, these teachings provide an approach to providing a series of productive interlaced amplitude electric pulses by controlling energy replenishment to and/or non-productive energy withdrawal of energy from the energy-storage unit as comprises a part of a hard-tube type pulse generator. These various approaches can be utilized alone or in any number of combinations and permutations as desired. Accordingly, it will be appreciated that these teachings are highly flexible in practice and can be readily scaled to accommodate a wide variety of application settings. It will further be appreciated that these teachings can be economically implemented and can even be utilized with previously fielded equipment to further leverage such legacy assets.

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept.

We claim:

1. A method to provide interlaced amplitude pulsing using a hard-tube type pulse generator having an energy-storage unit comprising at least one energy-storing capacitor, the method comprising:
    using the hard-tube type pulse generator and the energy-storage unit to provide a first productive electric pulse to an output load comprising at least one of a magnetron and a klystron to thereby produce an x-ray beam;
    subsequent to providing the first productive electric pulse and prior to providing a second interlaced productive electric pulse as part of a series of interlaced productive electric pulses, causing selective non-productive energy withdrawal of the energy-storage unit to further selectively deplete the energy-storage unit;
    using the hard-tube type pulse generator and the further selectively depleted energy-storage unit to provide the second interlaced productive electric pulse to the output load and having a predetermined and desired amplitude that is less than the first productive electric pulse.

2. The method of claim 1 wherein the hard-tube type pulse generator comprises a part of a radio frequency particle accelerator based, interlaced multi-energy radiation source.

3. The method of claim 1 wherein causing selective non-productive energy withdrawal of the energy-storage unit to further selectively deplete the energy-storage unit further comprises controlling energy replenishment of the energy-storage unit by, at least in part, intentionally not fully recharging the energy-storage unit after withdrawing some energy from the energy-storage unit to create one of the series of interlaced productive electric pulses.

4. The method of claim 3 wherein intentionally not fully recharging the energy-storage unit comprises not recharging the energy-storage unit after withdrawing the energy to create the one of the series of the interlaced productive electric pulses.

5. The method of claim 3 wherein controlling energy replenishment of the energy-storage unit comprises, at least in part, intentionally not fully recharging the energy-storage unit following each withdrawal of the energy to create at least some of a plurality of the series of interlaced productive electric pulses.

6. The method of claim 1 wherein controlling non-productive energy withdrawal of the energy-storage unit comprises, at least in part, selectively withdrawing energy from the energy-storage unit to achieve a particular energy availability to be used when creating a given one of the productive interlaced amplitude electric pulses.

7. The method of claim 6 wherein selectively withdrawing energy from the energy-storage unit comprises selectively withdrawing the energy from the energy-storage unit prior to creating the given one of the productive interlaced amplitude electric pulses.

8. The method of claim 7 wherein selectively withdrawing the energy from the energy-storage unit prior to creating the given one of the productive interlaced amplitude electric pulses comprises, at least in part, using at least one dummy load to selectively withdraw the energy.

9. The method of claim 8 wherein the dummy load is electrically parallel to an output load for the hard-tube type pulse generator.

10. The method of claim 7 wherein selectively withdrawing the energy from the energy-storage unit prior to creating the given one of the productive interlaced amplitude electric pulses comprises, at least in part, delivering at least one electric pulse to an output load while disabling another part of a corresponding radio frequency particle accelerator based radiation source such that no desired system product is produced.

11. The method of claim 10 wherein the corresponding radio frequency particle accelerator based radiation source comprises, at least in part, a particle source.

12. The method of claim 6 wherein selectively withdrawing energy from the energy-storage unit to achieve a particular amplitude availability to an output load when creating a given one of the productive interlaced amplitude electric pulses comprises, at least in part, selectively dividing the amplitude at the energy-storage unit between a dummy load and the output load.

13. The method of claim 12 wherein the dummy load comprises a selectively-configurable dummy load and wherein selectively withdrawing the energy from the energy-storage unit comprises selectively configuring the dummy load to bear part of a voltage available at the energy-storage unit while creating the given one of the productive interlaced amplitude electric pulses such that the output load receives a predetermined and desired amplitude for productive use.

14. The method of claim 1 wherein the output load comprises a primary winding of a transformer.

15. The method of claim 1 wherein the output load comprises an energy conversion device that consumes electric energy to generate other forms of energy.

16. An apparatus comprising:
a hard-tube type pulse generator having an energy storage unit comprising at least one energy-storing capacitor;
a control circuit configured to:
use the hard-tube type pulse generator and the energy-storage unit to provide a first productive electric pulse to an output load comprising at least one of a magnetron and a klystron to thereby produce an x-ray beam;
subsequent to providing the first productive electric pulse and prior to providing a second interlaced productive electric pulse to the output load as part of a series of interlaced productive electric pulses, cause selective non-productive energy withdrawal of the energy-storage unit to further selectively deplete the energy-storage unit;
wherein the hard-tube type pulse generator is configured to use the selectively depleted energy-storage unit to provide the second interlaced productive electric pulse having a predetermined and desired amplitude that is less than the first productive electric pulse.

17. The apparatus of claim 16 wherein the hard-tube type pulse generator comprises a part of a radio frequency particle accelerator based, interlaced multi-energy radiation source.

18. The apparatus of claim 16 wherein the control circuit is further configured to:
intentionally not fully recharge the energy-storage unit after withdrawing some energy from the energy-storage unit to create one of the series of interlaced productive electric pulses.

19. The apparatus of claim 18 wherein intentionally not fully recharging the energy-storage unit comprises not recharging the energy-storage unit after withdrawing the energy to create the one of the series of interlaced productive electric pulses.

20. The apparatus of claim 18 wherein the control circuit is configured to control energy replenishment of the energy-storage unit by, at least in part, intentionally not fully recharging the energy-storage unit following each withdrawal of the energy to create at least some of a plurality of the series of interlaced productive electric pulses.

21. The apparatus of claim 16 wherein the control circuit is configured to control non-productive energy withdrawal of the energy-storage unit by, at least in part, selectively withdrawing energy from the energy-storage unit to achieve a particular energy availability to be used when creating a given one of the productive interlaced amplitude electric pulses.

22. The apparatus of claim 21 wherein the control circuit is configured to selectively withdraw energy from the energy-storage unit by selectively withdrawing the energy from the energy-storage unit prior to creating the given one of the productive interlaced amplitude electric pulses.

23. The apparatus of claim 22 wherein the control circuit is configured to selectively withdraw the energy from the energy-storage unit prior to creating the given one of the productive interlaced amplitude electric pulses by, at least in part, using at least one dummy load to selectively withdraw the energy.

24. The apparatus of claim 23 wherein the dummy load is electrically parallel to an output load for the hard-tube type pulse generator.

25. The apparatus of claim 22 wherein the control circuit is configured to selectively withdraw the energy from the energy-storage unit prior to creating the given one of the productive interlaced amplitude electric pulses by, at least in part, delivering at least one electric pulse to an output load while disabling another part of a corresponding radio frequency particle accelerator based radiation source such that no desired system product is produced.

26. The apparatus of claim 25 wherein the corresponding radio frequency particle accelerator based radiation source comprises, at least in part, a particle source.

27. The apparatus of claim 21 wherein the control circuit is configured to selectively withdraw energy from the energy-storage unit to achieve a particular energy amplitude availability to an output load when creating a given one of the productive interlaced amplitude electric pulses by, at least in part, selectively dividing the amplitude at the energy-storage unit between a dummy load and the output load.

28. The apparatus of claim 27 wherein the dummy load comprises a selectively-configurable dummy load and wherein the control circuit is configured to selectively withdraw the energy from the energy-storage unit using a dummy load while also creating the given one of the productive interlaced amplitude electric pulses by selectively configuring the dummy load to bear part of a voltage available at the energy-storage unit while creating the given one of the productive interlaced amplitude electric pulses such that the output load receives a predetermined and desired amplitude for productive use.

29. The method of claim 16 wherein the output load comprises a primary winding of a transformer.

30. The method of claim 16 wherein the output load comprises an energy conversion device that consumes electric energy to generate other forms of energy.

* * * * *